(12) United States Patent
Kokubun et al.

(10) Patent No.: US 11,163,639 B2
(45) Date of Patent: Nov. 2, 2021

(54) MEMORY SYSTEM AND METHOD FOR CONTROLLING NONVOLATILE MEMORY

(71) Applicant: Kioxia Corporation, Minato-ku (JP)

(72) Inventors: Naoaki Kokubun, Yokohama (JP); Daiki Watanabe, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/816,396

(22) Filed: Mar. 12, 2020

(65) Prior Publication Data
US 2021/0089393 A1 Mar. 25, 2021

(30) Foreign Application Priority Data

Sep. 19, 2019 (JP) .............................. JP2019-170681

(51) Int. Cl.
*G06F 11/10* (2006.01)
*H03M 13/45* (2006.01)

(52) U.S. Cl.
CPC ......... *G06F 11/1068* (2013.01); *H03M 13/45* (2013.01)

(58) Field of Classification Search
CPC .................................................. G06F 11/1068
USPC .................... 714/764, 766, 767, 763
See application file for complete search history.

(56) References Cited

U.S. PATENT DOCUMENTS

| 7,468,854 | B2 * | 12/2008 | Yamashita ............. G11B 5/607 360/75 |
| 8,250,437 | B2 | 8/2012 | Sakurada et al. |
| 8,782,496 | B2 | 7/2014 | Sakaue et al. |
| 10,847,241 | B2 | 11/2020 | Yassine |
| 2018/0158536 | A1 | 6/2018 | Wu et al. |
| 2019/0026632 | A1 * | 1/2019 | Natsumeda ............. G06F 30/20 |
| 2019/0220348 | A1 * | 7/2019 | Kokubun ............. G06F 11/1012 |
| 2020/0081770 | A1 * | 3/2020 | Kumano ............. G06F 11/1068 |

FOREIGN PATENT DOCUMENTS

| JP | 2012-244305 A | 12/2012 |
| JP | 5197544 B2 | 5/2013 |
| JP | 2019-125910 A | 7/2019 |

* cited by examiner

*Primary Examiner* — Fritz Alphonse
(74) *Attorney, Agent, or Firm* — Oblon, McClelland, Maier & Neustadt, L.L.P.

(57) ABSTRACT

A memory system according to an embodiment includes a nonvolatile memory and a memory controller. The memory controller converts a received value read from the nonvolatile memory into first likelihood information by using a first conversion table, executes decoding on the first likelihood information and outputting a posterior value, outputs an estimated value of the received value obtained on the basis of the posterior value in a case where the decoding is successful. The memory controller generates a second conversion table on the basis of the posterior value in a case where the decoding fails. The memory controller converts the received value into second likelihood information by using the second conversion table in a case where the second conversion table has been generated, and executes decoding on the second likelihood information and outputs a posterior value.

16 Claims, 7 Drawing Sheets

MEMORY SYSTEM AND METHOD FOR CONTROLLING NONVOLATILE MEMORY

CROSS-REFERENCE TO RELATED APPLICATIONS

This application is based upon and claims the benefit of priority from Japanese Patent Application No. 2019-170681, filed on Sep. 19, 2019; the entire contents of which are incorporated herein by reference.

FIELD

Embodiments described herein relate generally to memory systems.

BACKGROUND

In a memory system including a nonvolatile memory such as flash memory, data to be written to the nonvolatile memory is generally encoded from the viewpoint of data protection. Therefore, the encoded data is decoded at the time of reading the data stored in the memory system.

Methods for reading data stored in the nonvolatile memory include hard decision reading (also referred to as hard bit read) and soft decision reading (also referred to as soft bit read). In hard decision reading in a case where each of memory cells of the nonvolatile memory is a single level cell (SLC) that stores 1-bit data, the data stored in each of memory cells is read as a bit value of '0' or '1'. In contrast, in soft decision reading for SLC, data is read as information related to the probability that stored data is '0' or '1'. The information related to the probability typically uses a log-likelihood ratio (LLR). The LLR is information representing the probability that the stored bit is '0' and the probability that it is '1' using a logarithmic ratio. In the soft decision reading, data read from the nonvolatile memory is converted into an LLR sequence according to a previously generated table referred to as an LLR table and is decoded.

DETAILED DESCRIPTION

Figure 1:
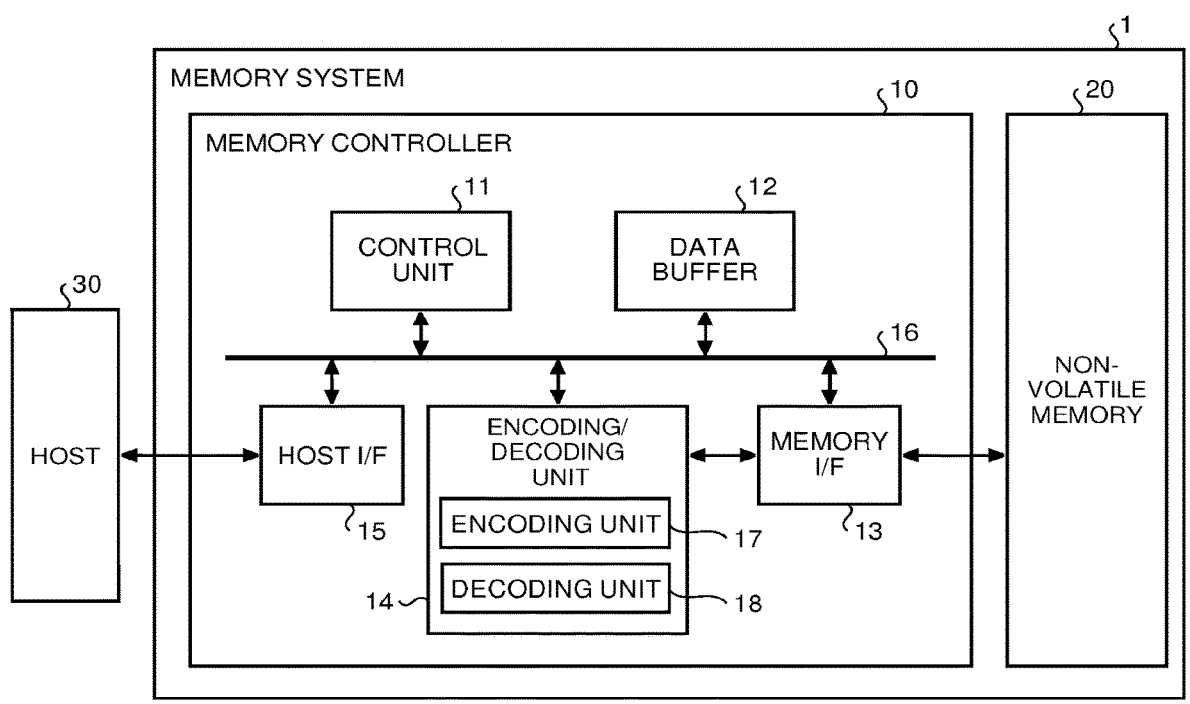
FIG. 1 is a block diagram illustrating a schematic configuration example of a memory system according to a first embodiment.

According to an embodiment, there is provided a memory system including: a nonvolatile memory; a memory interface that reads data recorded in the nonvolatile memory as a received value; a converting unit that converts the received value read from the nonvolatile memory into first likelihood information by using a first conversion table; a decoder that decodes the first likelihood information; a control unit that, in a case where decoding by the decoder is successful, outputs an estimated value for the received value being a decoding result obtained by the decoding; and a generation unit that, in a case where decoding of the first likelihood information by the decoder fails, generates a second conversion table on the basis of a decoding result obtained by the decoding, in which in a case where the generation unit has generated the second conversion table, the converting unit converts the received value into second likelihood information using the second conversion table, and the decoder decodes the second likelihood information.

Hereinafter, a memory system according to an embodiment will be described with reference to the attached drawings. The present invention is not limited to the following embodiments.

In description of the embodiments, terms are defined as follows.

"Channel (also referred to as stress)" is a probabilistic model representing the influence of noise on a written value (also referred to as transmitted value) x, and is characterized by a channel matrix. Factors that characterize the channel matrix include program disturb, data retention, read disturb, and temperature crossing.

"Likelihood" is a conditional probability $P(y|x)$ of obtaining an output value (also referred to as a received value) y of a channel when a certain written value x is given.

The "channel matrix" is a matrix that describes likelihood for all (x, y) pairs.

"Log-likelihood ratio (LLR)" is information representing the likelihood when the stored bit is '0' or the likelihood when the stored bit is '1' in a logarithmic ratio, and also referred to as likelihood information or an LLR value.

"Posterior probability" is a conditional probability $P(x|y)$ that the written value is x when a received sequence $\{y\}$ is obtained.

The "a posteriori LLR" is a log-likelihood ratio related to the posterior probability. For example, the a posteriori LLR is information as logarithmic ratio representation of a conditional probability $P(0|y)$ that the written value is '0' and a conditional probability $P(1|y)$ that the written value is '1' when the received sequence $\{y\}$ is obtained.

"LLR table" is a table (conversion table) indicating a correspondence between an output value y of a channel and LLR that is an input to the decoder. The output value y is converted into an LLR value on the basis of the LLR table. That is, the value $\ln[P(y|x=0)/P(y|x=1)]$ obtained from the channel matrix is converted to an LLR value corresponding to the output value y. In general, various LLR tables are prepared for various channel matrices.

A "default LLR table" is an LLR table used by default setting. An example of a table to be used as the default LLR table is an LLR table obtained from a channel that is likely to be used in consideration of assumable modifications in various channels.

"ECC frame" is a data block for decoder operation, representing a data block for reconstructing a codeword from a sequence of received values.

"Estimated write value (also referred to as an estimated value) k of a decoding result" is an individual estimated write value that is an output of the decoder. Therefore, a sequence $\{k\}$ of an estimated written value k corresponding to the ECC frame is obtained at the end of decoding. Successful decoding means that the answer sequence $\{x\}$ and the decoding result sequence $\{k\}$ are completely match. In contrast, failure in decoding means that there is a part where x≠k in the ECC frame, and the sequences $\{x\}$ and $\{k\}$ do not match. To obtain a true result of success or failure in decoding, the answer sequence needs to be known. Not knowing the answer sequence, the decoder does not know a true result of success or failure in decoding. However, the decoder has estimation information about the success or failure in decoding. In the context of the following description of decoding, a success or failure of decoding means success or failure estimated by the decoder.

A "true channel matrix" is a channel matrix having a conditional probability P(y|x) based on x being a correct answer, as an element. In contrast, an "estimated channel matrix" is a channel matrix having a conditional probability P(y|k) using the estimated written value k output from the decoder, as an element.

The "estimated LLR table" is an LLR table estimated from the decoding result.

A "symbol" is at least one constituent unit of an error correction code. One symbol is formed of, for example, 1-bit elements (elements of binary fields) or alphabetic elements such as finite fields other than binary fields.

First Embodiment

First, a memory system according to a first embodiment will be described in detail with reference to the drawings. FIG. 1 is a block diagram illustrating a schematic configuration example of a memory system according to the first embodiment. As illustrated in FIG. 1, a memory system 1 includes a memory controller 10 and a nonvolatile memory 20. The memory system 1 can be connected to a host 30 and is illustrated in a state connected to the host 30, in FIG. 1. The host 30 may be an electronic device such as a personal computer or a mobile terminal.

The nonvolatile memory 20 is a nonvolatile memory that stores data in a nonvolatile manner, and an example of this is a NAND flash memory (hereinafter simply referred to as a NAND memory). The following description uses an exemplary case where the NAND memory is used as the nonvolatile memory 20. However, the nonvolatile memory 20 can include storage devices such as a three-dimensional structure flash memory, a Resistive Random Access Memory (ReRAM), or a Ferroelectric Random Access Memory (FeRAM), other than the NAND memory. The nonvolatile memory 20 need not be a semiconductor memory. The present embodiment can be applied to various storage media other than the semiconductor memory.

The memory system 1 may be various memory systems including the nonvolatile memory 20, such as a Solid State Drive (SSD) or a memory card incorporating the memory controller 10 and the nonvolatile memory 20 as one package.

The memory controller 10 controls writing to the nonvolatile memory 20 in accordance with a write request from the host 30. The memory controller 10 controls reading from the nonvolatile memory 20 in accordance with a read request from the host 30. An example of the memory controller 10 is a semiconductor integrated circuit configured as a System On a Chip (SoC). The memory controller 10 includes a host interface (host I/F) 15, a memory interface (memory I/F) 13, a control unit 11, an encoding/decoding unit (codec) 14, and a data buffer 12. The host I/F 15, the memory I/F 13, the control unit 11, the encoding/decoding unit 14, and the data buffer 12 are interconnected via an internal bus 16. Part or all of the operation of each of components of the memory controller 10 described below may be implemented by execution of firmware by a central processing unit (CPU) or may be implemented by hardware.

The host I/F 15 performs a process according to an interface standard with respect to the host 30, and outputs a command received from the host 30, user data to be written, or the like to the internal bus 16. The host I/F 15 transmits user data read from the nonvolatile memory 20 and restored, a response from the control unit 11, or the like to the host 30.

The memory I/F 13 performs a writing process to the nonvolatile memory 20 on the basis of an instruction from the control unit 11. Further, the memory I/F 13 performs a reading process from the nonvolatile memory 20 on the basis of an instruction from the control unit 11.

The control unit 11 comprehensively controls each of components of the memory system 1. In a case where a command is received from the host 30 via the host I/F 15, the control unit 11 performs control according to the command. For example, the control unit 11 instructs the memory I/F 13 to write user data and parity data to the nonvolatile memory 20 in accordance with a command from the host 30. Further, the control unit 11 instructs the memory I/F 13 to read user data and parity data from the nonvolatile memory 20 in accordance with a command from the host 30.

Moreover, in a case where a write request is received from the host 30, the control unit 11 determines a storage region (memory region) on the nonvolatile memory 20 for user data stored in the data buffer 12. That is, the control unit 11 manages the writing destination of user data. The correspondence between the logical address of the user data received from the host 30 and the physical address indicating the storage region on the nonvolatile memory 20 that stores the user data will be stored as an address conversion table.

Moreover, in a case where a read request is received from the host 30, the control unit 11 converts the logical address designated by the read request into a physical address using the above-described address conversion table, and instructs the memory I/F 13 to perform reading from the physical address.

In typical cases, a NAND memory performs writing and reading in data units referred to as a page, and performs erasing in data units referred to as a block. In the present embodiment, a plurality of memory cells connected to an identical word line is referred to as a memory cell group. In a case where the memory cell is a single level cell (SLC), one memory cell group corresponds to one page. In a case where the memory cell is a multiple level cell (MLC), one memory cell group corresponds to a plurality of pages. In the present description, a MLC includes a Triple Level Cell (TLC), and a Quad Level Cell (QLC). Each of memory cells is connected to a word line as well as to a bit line. Therefore, each of memory cells can be identified by an address for identifying a word line and an address for identifying a bit line.

The data buffer 12 temporarily stores user data received by the memory controller 10 from the host 30 until the user data is stored in the nonvolatile memory 20. The data buffer 12 temporarily stores the user data read from the nonvolatile memory 20 until the user data is transmitted to the host 30. The data buffer 12 can be implemented by using general-purpose memory such as a Static Random Access Memory (SRAM) or a Dynamic Random Access Memory (DRAM). The data buffer 12 may be mounted outside the memory controller 10, rather than being built in the memory controller 10.

User data transmitted from the host 30 is transferred to the internal bus 16 and temporarily stored in the data buffer 12. The encoding/decoding unit 14 encodes user data stored in the nonvolatile memory 20 to generate a codeword. The encoding/decoding unit 14 also decodes the received word read from the nonvolatile memory 20 and restores user data. Accordingly, the encoding/decoding unit 14 includes an encoding unit (Encoder) 17 and a decoding unit (Decoder) 18. The data encoded by the encoding/decoding unit 14 may include control data used inside the memory controller 10, in addition to user data.

Next, the writing process according to the present embodiment will be described. The control unit 11 instructs the encoding unit 17 to encode user data at writing to the nonvolatile memory 20. At that time, the control unit 11 determines a storage location (storage address) of the codeword in the nonvolatile memory 20, and instructs the memory I/F 13 about the determined storage location.

On the basis of the instruction from the control unit 11, the encoding unit 17 encodes the user data on the data buffer 12 to generate a codeword. Examples of applicable coding schemes include methods using an algebraic code such as Bose-Chaudhuri-Hocquenghem (BCH) codes and Reed-Solomon (RS) codes, coding schemes using these codes as component codes (such as a product code), and a coding scheme using a code based on a sparse graph such as Low-Density Parity-Check (LDPC) codes. The memory I/F 13 performs control to store the codeword to the storage location on the nonvolatile memory 20 instructed by the control unit 11.

Next, a process at the time of reading from the nonvolatile memory 20 of the present embodiment will be described. At the time of reading from the nonvolatile memory 20, the control unit 11 designates an address on the nonvolatile memory 20 and instructs the memory I/F 13 to perform reading. The control unit 11 also instructs the decoding unit 18 to start decoding. The memory I/F 13 reads a received word from the designated address of the nonvolatile memory 20 in accordance with an instruction from the control unit 11, and inputs the read received word to the decoding unit 18. The decoding unit 18 decodes the received word read from the nonvolatile memory 20.

Figure 2:
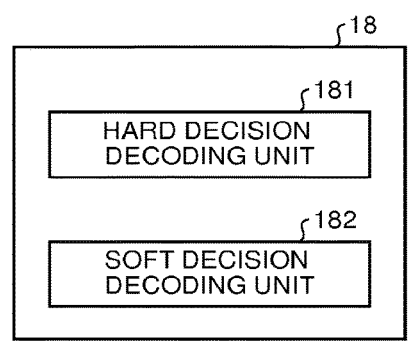
FIG. 2 is a block diagram illustrating a configuration example of a decoding unit according to the first embodiment.

The decoding unit 18 decodes the received word read from the nonvolatile memory 20. FIG. 2 is a block diagram illustrating a configuration example of the decoding unit according to the present embodiment. As illustrated in FIG. 2, the decoding unit 18 includes a hard decision decoding unit 181 that executes hard decision decoding of inputting a hard decision value and outputting a hard decision value as a result; and a soft decision decoding unit 182 that executes soft decision decoding of inputting a soft decision value and outputting a soft decision value as a result. In general, soft decision decoding is characterized by higher error correction capability but longer processing time, compared with hard decision decoding. Therefore, it is possible, for example, to have a configuration in which the hard decision decoding unit 181 first performs hard decision decoding, and then the soft decision decoding unit 182 performs soft decision decoding in a case where decoding is unsuccessful by the hard decision decoding. However, the present embodiment is not limited to such a configuration, and the hard decision decoding unit 181 may be omitted, for example.

Figure 3:
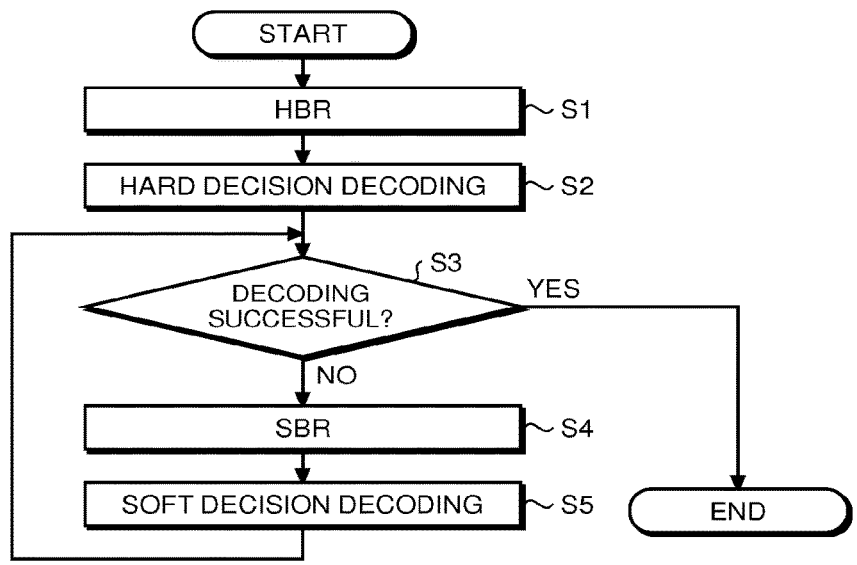
FIG. 3 is a flowchart illustrating an example of a data read process according to the first embodiment.

FIG. 3 is a flowchart illustrating an example of data read process according to the first embodiment. The control unit 11 instructs the memory I/F 13 to read data from the nonvolatile memory 20 using hard bit read (HBR) by designating an address for the read. In response to this instruction, the memory I/F 13 executes hard bit read (step S1). The hard bit read is a read method of reading each of bits constituting the data to be read as a received word having hard decision values of 0 or 1. The received word having read hard decision values is input to the decoding unit 18 of the encoding/decoding unit 14 via the internal bus 16, for example.

In a case where the nonvolatile memory 20 is NAND memory, electrons are injected at writing data such that the number of electrons (charge amount) of the floating gate corresponds to one of a plurality of distributions (threshold voltage distributions) according to the written value x. Here, to simplify the description, an example of a single level cell (SLC) in which one memory cell stores 1 bit will be described. In the case of SLC, one of two distributions corresponds to 0 and the other corresponds to 1. In a case where a voltage is applied to the memory cell, a current flows when an applied voltage is equal to or larger than a voltage value corresponding to the charge amount of the memory cell, while no current flows when an applied voltage is less than the voltage value. Therefore, the voltage serving as a boundary is determined for each of memory cells in accordance with the charge amount of the memory cell. Here, the voltage value determined in accordance with the charge amount of the memory cell is referred to as a threshold voltage. In an initial state, a charge is injected so as to correspond to one of the two threshold voltage distributions, and then, a reference read voltage (also referred to as a reference read level) that separates the two threshold voltage distributions is applied to the memory cell at the time of reading, enabling determination whether the data stored in the memory cell is 1 or 0.

In hard bit read, a reference read voltage is applied to the memory cell to determine whether the data stored in the memory cell is 1 or 0, and the determined result is output as a received value y. Note that the read voltage applied at the time of hard bit read may be changed from the reference read voltage in some cases.

Returning to the description of FIG. 3. The control unit 11 instructs the decoding unit 18 to perform hard decision decoding. In response to this instruction, the hard decision decoding unit 181 of the decoding unit 18 performs hard decision decoding on the received word (step S2). Specifically, the hard decision decoding unit 181 performs decoding such as bounded distance decoding on the received word. However, the hard decision decoding performed by the hard decision decoding unit 181 is not limited to the bounded distance decoding and may be any type of hard decision decoding.

After step S2, the hard decision decoding unit 181 determines whether the decoding is successful, and notifies the control unit 11 of the determination result. The control unit 11 determines whether the decoding is successful (step S3) on the basis of the notification from the hard decision decoding unit 181, and finishes the read process in a case where the decoding is successful (YES in step S3).

In contrast, in a case where the decoding has failed (NO in step S3), the control unit 11 designates an address for the read from the memory I/F 13 and reads data from the nonvolatile memory 20 by soft bit read (SBR). In response to this instruction, the memory I/F 13 executes soft bit read of obtaining the received value y containing a result of reading the data stored in each of memory cells also with one or more read voltages set at a predetermined step size with respect to a reference read voltage used for hard bit read (step S4). The read received value y is input to the decoding unit 18 of the encoding/decoding unit 14 via the internal bus 16, as a sequence {y} in units of ECC frames, for example.

In step S5, the control unit 11 instructs the decoding unit 18 to perform soft decision decoding, and in response to this, the soft decision decoding unit 182 of the decoding unit 18 executes soft decision decoding on the sequence {y} of the received value y input in units of ECC frames (step S5). Thereafter, this operation returns to step S3. Details of the soft decision decoding according to the present embodiment will be described in the following.

Next, the soft decision decoding according to the present embodiment will be described in detail. First, a relationship between "estimation of channel needed for soft decision decoding" and a "LLR table" will be described. For the sake of simplicity, it is assumed, in the following description, that the value that a transmitted value x can take is 0 or 1, and the value that the received value y can take is 0, 1, 2, or 3.

In soft decision decoding, when the channel to be estimated is determined, the transmitted value x written to the nonvolatile memory 20 is stored, and which of the received value y is a result of change of the transmitted value x read from the nonvolatile memory 20 is stored. Therefore, the following description assumes that a histogram as illustrated in Table 1 below is obtained.

TABLE 1

|       | y = 0 | y = 1 | y = 2 | y = 3 |
|-------|-------|-------|-------|-------|
| x = 0 | 1     | 125   | 729   | 2197  |
| x = 1 | 3375  | 1331  | 343   | 27    |

Table 1 lists that, as a result of 8128 observations, the (x=0, y=0) pair is observed once, the (x=1, y=0) pair is observed 3375 times, the (x=0, y=1) pair is observed 125 times, the (x=1, y=1) pair is observed 1331 times, the (x=0, y=2) pair is observed 729 times, the (x=1, y=2) pair is observed 343 times, the (x=0, y=3) pair is observed 2197 times, and the (x=1, y=3) pair is observed 27 times.

The conditional probability P(y|x) of the true channel is estimated as follows on the basis of Table 1 assumed in this manner. That is, when the number of times of observations (hereinafter also referred to as frequency) of each of the (x, y) pairs is F (x, y), a conditional probability P(y=0|x=0) that the output value y is '0' when the written value x is '0' is obtained as in the following Formula (1), and the conditional probability P that the output value y='0' when the written value x is '1' is obtained as in the following Formula (2).

$$P(y=0 \mid x=0) = \frac{F(x=0, y=0)}{\sum_{y'} F(x=0, y')} = \frac{1}{3052} \quad (1)$$

$$P(y=0 \mid x=1) = \frac{F(x=1, y=0)}{\sum_{y'} F(x=1, y')} = \frac{3375}{5076} \quad (2)$$

Therefore, an LLR table will be generated, for the assumed channel, so that the LLR value obtained from the following Formula (3) is to be assigned in a case where the received value y is 0, for example. The LLR value in Formula (3) is rounded to the first decimal lace.

$$LLR(y=0) = \ln \frac{P(y=0 \mid x=0)}{P(y=0 \mid x=1)} = -7.6 \quad (3)$$

Similarly, the LLR table is generated so that LLRs obtained from the following Formulas (4) to (6) are to be assigned even when the other received values y are 1 to 3, individually. The LLR values in Formulas (4) to (6) are rounded to the first decimal place.

$$LLR(y=1) = \ln \frac{P(y=1 \mid x=0)}{P(y=1 \mid x=1)} = -1.9 \quad (4)$$

$$LLR(y=2) = \ln \frac{P(y=2 \mid x=0)}{P(y=2 \mid x=1)} = 1.3 \quad (5)$$

$$LLR(y=3) = \ln \frac{P(y=3 \mid x=0)}{P(y=3 \mid x=1)} = 4.9 \quad (6)$$

The LLR table generated as described above can be sufficiently closer to the LLR table generated from the true channel matrix by collecting a sufficient number of (x, y) pairs. In other words, if a sufficient number of (x, y) pairs can be successfully collected, it is possible to accurately perform "estimation of a channel needed for soft decision decoding", enabling generation of the LLR table ideal for the channel to be estimated.

Next, "estimation of channel" will be described. For example, there are cases where LLR tables cannot be prepared in advance for all different channels in a case where the number of channels to be estimated is very large. When the decoding is successful in such a case, the estimated transmitted value k matches the transmitted value x. Therefore, the generation of the LLR table as described above is executed using the estimated value k instead of the transmitted value x, and the generated LLR table will be used for the ECC frame that has failed to be decoded in a similar channel. This would make it possible to suppress degradation of decoding characteristics even when the LLR table cannot be prepared in advance.

However, even when the decoding has failed, in a case where the number of error bits has been reduced to some extent by this decoding, there will be a case where the above LLR table generation is executed using the decoding result, and the newly obtained LLR table (hereinafter referred to as an estimated LLR table) may be used to achieve successful decoding.

As described above, in the decoding in the memory system, there is high probability of decoding failure when the channel assumed in advance is different from the actual channel. However, it is possible, in some cases, to use the decoding result of the failure to bring the channel to be estimated closer to the true channel.

Therefore, even in a case where decoding fails, the present embodiment enables recovery from the decoding failure attributed to the mismatch of channels by executing a procedure of estimating the channel from the result of the failure, in other words, performing the procedure of generating the LLR table one or more times.

Furthermore, in the present embodiment, the LLR table is generated using a posterior value, which is the information from which the estimated value k is obtained, instead of the estimated value k. The posterior value is, for example, an a posteriori LLR or a posterior probability. In the following, a case where the a posteriori LLR is used as the posterior value will be described as an example. The a posteriori LLR is a log-likelihood ratio related to the posterior probability, and is an output of a decoder (decoder 102 or the like to be described below) including estimation based on code constraints in addition to the sequence {y} of received values. In the following, a sequence of the a posteriori LLR output from the decoder is represented as {l}. The estimated value k is obtained from the a posteriori LLR. In the normal case where the probability that the stored bit is '0' and the probability that it is '1' is the same, the positive/negative of a value of the a posteriori LLR corresponds to bit '0' and '1', and the absolute value of the a posteriori LLR is related to the reliability of estimation of a written value by a decoder (decoder 102 to be described below).

Figure 4:
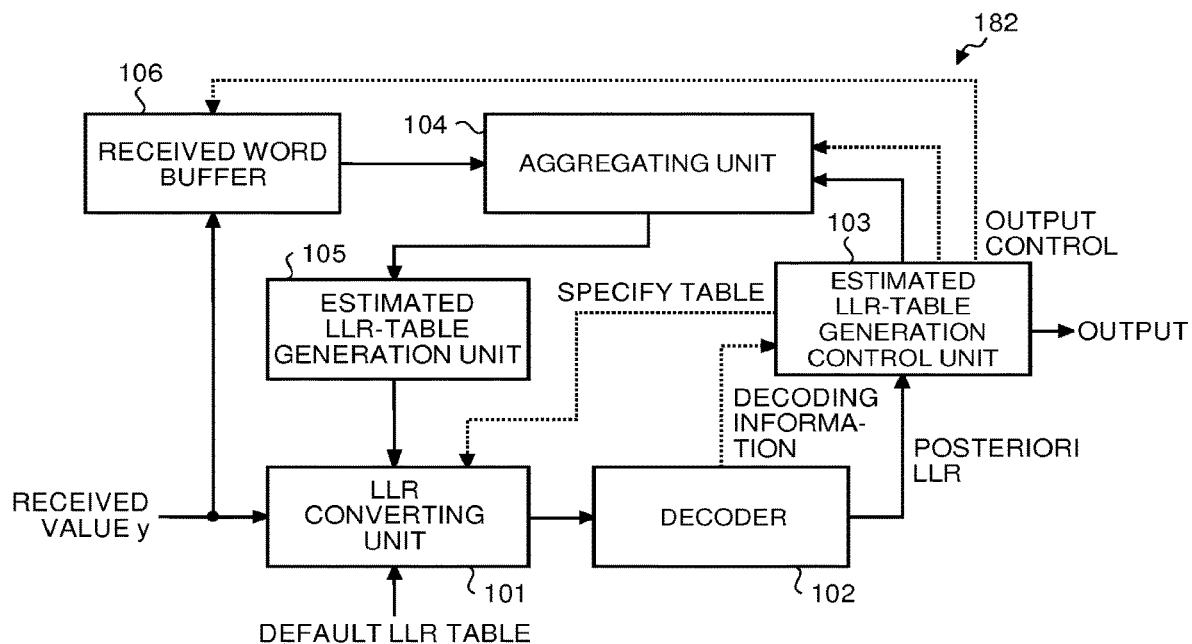
FIG. 4 is a block diagram illustrating a more detailed configuration example of a soft decision decoding unit according to the first embodiment.

FIG. 4 is a block diagram illustrating a more detailed configuration example of a soft decision decoding unit according to the present embodiment. As illustrated in FIG. 4, the soft decision decoding unit 182 includes an LLR converting unit 101, a decoder 102, an estimated LLR-table generation control unit 103, an aggregating unit 104, an estimated LLR-table generation unit 105, and a received word buffer 106.

In this configuration, the received word buffer 106 stores a sequence {y} of received values y in units of ECC frames. Specifically, the received word buffer 106 is input with the sequence {y} of received values y read from the nonvolatile memory 20 per ECC frame and stores the sequence {y} therein. Moreover, the estimated LLR-table generation control unit 103 inputs, to the received word buffer 106, an output start instruction, and either one of information designating the related ECC frame for the sequence {y} of the received value y to be output and information designating whether to output a specific received value y in the ECC frame. Subsequently, in response to the output start instruction, the received word buffer 106 outputs the designated sequence {y} or the designated received value y among the currently stored received values y in the units of ECC frames, to the aggregating unit 104.

The estimated LLR-table generation control unit 103 controls a process of generating an estimated LLR table from a specific (l, y) pair. Specifically, the a posteriori LLR sequence {l} as a decoding result from the decoder 102 is input to the estimated LLR-table generation control unit 103. Moreover, information obtained after decoding, such as whether decoding has been successful or failed, is input to the estimated LLR-table generation control unit 103. Subsequently, the estimated LLR-table generation control unit 103 determines whether to output the input an a posteriori LLR sequence {l} to the outside or to the aggregating unit 104, and outputs the sequence {l} of the a posteriori LLR to the destination determined. The estimated LLR-table generation control unit 103 also outputs a signal for instructing the received word buffer 106 to start output and a control signal for controlling the aggregating unit 104.

The aggregating unit 104 stores (l, y) pairs. Specifically, the estimated LLR-table generation control unit 103 inputs the selected sequence {l} of the a posteriori LLR in units of ECC frames to the aggregating unit 104. The received word buffer 106 inputs, to the aggregating unit 104, the sequence {y} of the received value y belonging to the same ECC frame as the sequence {l} of the a posteriori LLR that is input from the estimated LLR-table generation control unit 103. The aggregating unit 104 stores (l, y) pairs from the input sequences {l} and {y}. Furthermore, the aggregating unit 104 outputs the stored (l, y) pairs to the estimated LLR-table generation unit 105. Note that the estimated LLR-table generation control unit 103 also inputs a reset signal of the aggregated result, a control signal that notifies the output timing, or the like to the aggregating unit 104.

The estimated LLR-table generation unit 105 calculates an estimated LLR table from the (l, y) pair input from the aggregating unit 104. The estimated LLR-table generation unit 105 then outputs an estimated LLR table obtained by calculation to the LLR converting unit 101. For example, using the following Formula (7), the estimated LLR-table generation unit 105 calculates the LLR value to be set in the estimated LLR table.

$$l^{(s+1)}(y) = \ln\frac{\sum_{i \in \boldsymbol{I}(y)} \sigma(l_{APP,i}^{(s)})}{\sum_{i \in \boldsymbol{I}(y)} \sigma(-l_{APP,i}^{(s)})} - \ln\frac{\sum_{i=1}^{n} \sigma(l_{APP,i}^{(s)})}{\sum_{i=1}^{n} \sigma(-l_{APP,i}^{(s)})} \quad (7)$$

$S(S \geq 0)$ is a count value representing the number of iterations of estimated LLR table generation. $l^{(S+1)}(y)$ is an LLR value corresponding to the received value y of the estimated LLR table generated for the (S+1)th time. I(y) is a set of symbols having received value y. $l^{(S)}_{APP,i}$ is an a posteriori LLR value calculated by soft decision decoding using the designated LLR table for the symbol i included in I(y). σ is a sigmoid function. n is the total number of (l, y) tabulated.

The LLR converting unit 101 converts the received value y read and input from the nonvolatile memory 20 into an LLR value by using the LLR table or the estimated LLR table designated by the estimated LLR-table generation control unit 103. Specifically, the sequence {y} of received values y read from the nonvolatile memory 20 is input to the LLR converting unit 101. Furthermore, a default LLR table and an LLR table that is output from the estimated LLR-table generation unit 105 are also input to the LLR converting unit 101. Furthermore, designation information of the LLR table that is output from the estimated LLR-table generation control unit 103 is also input to the LLR converting unit 101. The LLR converting unit 101 then outputs a sequence of LLR values obtained by converting the received value y using the LLR table designated by the estimated LLR-table generation control unit 103, to the decoder 102.

The decoder 102 calculates decoding-related information and a sequence {l} of the a posteriori LLR from a sequence of the LLR value in units of ECC frames. Specifically, the LLR converting unit 101 inputs a sequence of the LLR value to the decoder 102. Note that the sequence of the LLR value corresponding to an ECC frame is input to the decoder 102 by one decoding. The decoder 102 then outputs the sequence {l} of the a posteriori LLR obtained by decoding the input sequence of the LLR value, to the estimated LLR-table generation control unit 103. Note that the decoder 102 outputs the sequence {l} corresponding to the ECC frame as a result of one decoding. The decoder 102 also outputs information obtained by decoding, such as success or failure of decoding, to the estimated LLR-table generation control unit 103.

Figure 5:
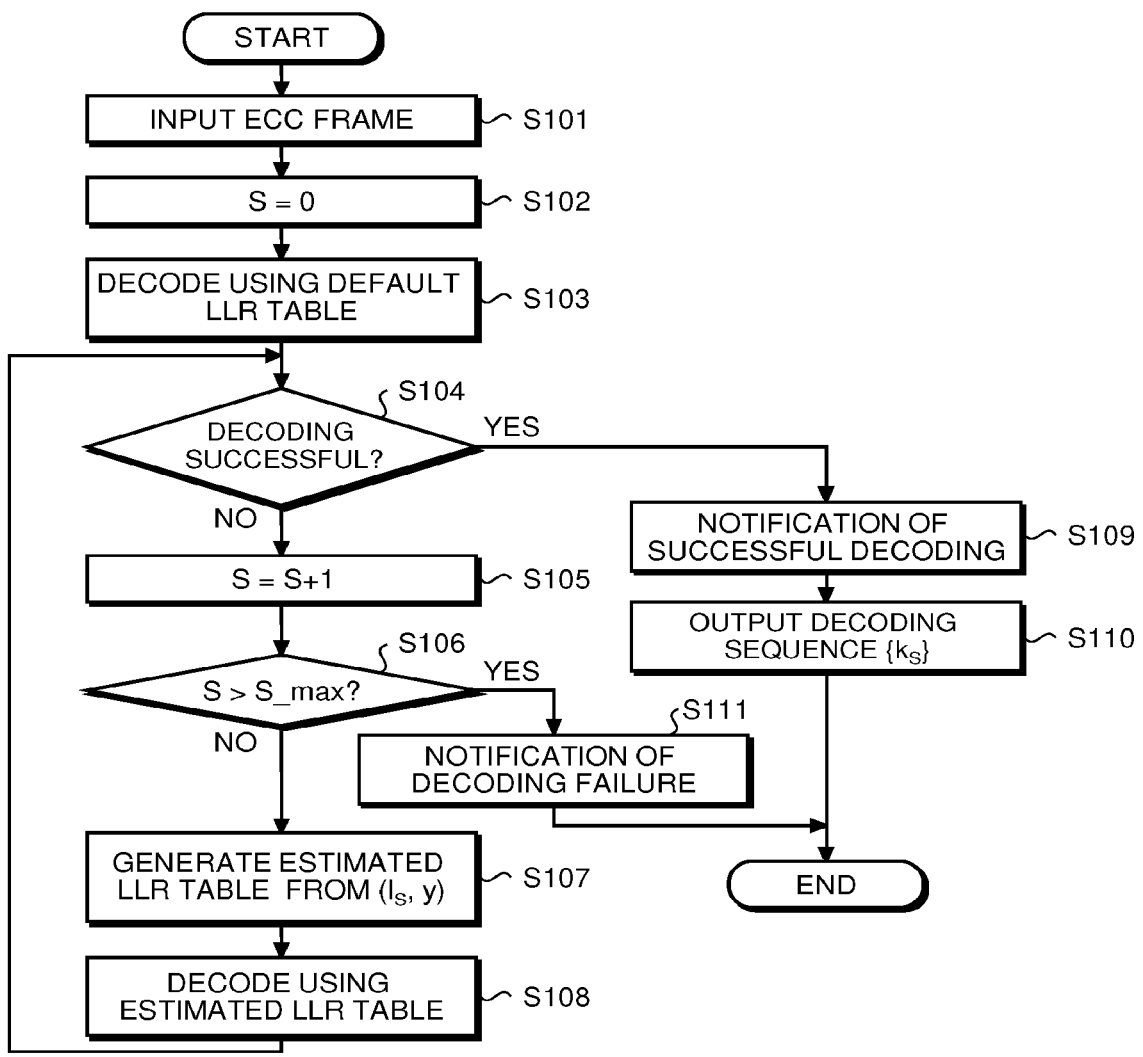
FIG. 5 is a flowchart illustrating a schematic example of a decoding operation according to the first embodiment.

Next, the decoding operation according to the present embodiment will be described in detail with reference to the drawings. FIG. 5 is a flowchart illustrating a schematic example of the decoding operation according to the present embodiment. As illustrated in FIG. 5, in this operation, first, a sequence {y} of received values y in units of ECC frames read from the nonvolatile memory 20 by the memory I/F 13 is input to the soft decision decoding unit 182 (step S101). The sequence {y} input to the soft decision decoding unit 182 is stored in the received word buffer 106 and input to LLR converting unit 101.

Next, for example, the estimated LLR-table generation control unit 103 resets a count value S of a counter (not illustrated) that counts the number of iterations of estimated LLR table generation (S=0) (step S102). Subsequently, the sequence {y} of the received value y that has been input is decoded using a predetermined LLR table (step S103). Specifically, the estimated LLR-table generation control unit 103 inputs an instruction for which the default LLR table is used as the LLR table for the input sequence {y} of the received value y, on the basis of count value S being 0, to the LLR converting unit 101. Using the designated default LLR table, the LLR converting unit 101 converts the sequence {y} of the received value y into a sequence of LLR value, and inputs the obtained sequence of LLR value to the decoder 102. The decoder 102 decodes the sequence of the input LLR value, and outputs the sequence {l} of the a posteriori LLR, which is obtained as a result of decoding, and information such as success or failure of decoding, to the estimated LLR-table generation control unit 103. In the following description, the a posteriori LLR obtained at the count value S is denoted as $l_S$, and the sequence of ls at the count value S is denoted as a decoded sequence $\{l_S\}$.

Next, for example, the estimated LLR-table generation control unit 103 determines whether the decoding is successful on the basis of information input from the decoder 102 (step S104). In a case where the decoding is successful (YES in step S104), the operation proceeds to step S109. In contrast, in a case where the decoding has failed (NO in step S104), the estimated LLR-table generation control unit 103 increments the count value S by 1 (step S105). Subsequently, the estimated LLR-table generation control unit 103 determines whether the count value S is greater than a maximum value S_max of the number of iterations (step S106). The maximum value S_max is an upper limit to avoid repeated generation of the estimated LLR table (steps S104 to S108) based on the decoding result that has failed until the decoding is successful. In a case where the count value S is greater than the maximum value S_max (YES in step S106), the operation proceeds to step S111. In contrast, in a case where the count value S is the maximum value S_max or less (NO in step S106), the operation proceeds to step S107.

In step S107, an estimated LLR table is generated from a ($l_S$, y) pair that includes the a posteriori LLR $l_S$ obtained by decoding in step S103 or S108, and the received value y. Specifically, the aggregating unit 104 generates the ($l_S$, y) pair from the sequence $\{l_S\}$ of the a posteriori LLR and the sequence {y} of the received value y, and stores this pair. The a posteriori LLR is obtained from the estimated LLR-table generation control unit 103. The received value y is obtained from the received word buffer 106. The aggregating unit 104 then inputs the ($l_S$, y) pair to the estimated LLR-table generation unit 105. The estimated LLR-table generation unit 105 generates an estimated LLR table by using the input ($l_S$, y) and a formula, for example, Formula (7) described above. The generated estimated LLR table is input to the LLR converting unit 101.

Next, the sequence {y} of received value y is decoded using the estimated LLR table (step S108). Specifically, on the basis of, for example, a non-zero count value S the estimated LLR-table generation control unit 103 inputs a designation instruction to the LLR converting unit 101. The designation instruction is instruction for which a newly generated estimated LLR table is used as the LLR table for the sequence {y} of the received value y. Using the designated estimated LLR table, the LLR converting unit 101 converts the sequence {y} of the received value y into a sequence of LLR value, and inputs the obtained sequence of LLR values to the decoder 102. The decoder 102 decodes the sequence of input LLR value, and outputs the sequence $\{l_S\}$ of the a posteriori LLR, which is obtained as a result of decoding, and information such as success or failure of decoding, to estimated LLR-table generation control unit 103. Thereafter, the operation returns to step S104.

In step S109, in a case where decoding, that is, step S103 or S108 is successful (YES in step S104), the decoding success is notified from the estimated LLR-table generation control unit 103 to the control unit 11 (refer to FIG. 1). The estimated LLR-table generation control unit 103 also outputs a decoded sequence $\{k_S\}$ of an estimated value $k_S$ generated from the sequence $\{l_S\}$ of the a posteriori LLR obtained by decoding (step S110). Thereafter, the decoding operation is finished. Note that the output decoded sequence $\{k_S\}$ will be stored in the data buffer 12 (refer to FIG. 1), for example, restored to user data that is a written value, and thereafter transmitted to the host 30 that issued the read request.

In addition, in step S111, that is, in a case where decoding is not successful even after repeated generation of the estimated LLR table until the count value S reaches the maximum value S_max (YES in step S106), the estimated LLR-table generation control unit 103 notifies the control unit 11 (refer to FIG. 1) of the decoding failure, for example, to finish the decoding operation. In response to this, for example, the control unit 11 transmits a read error of the requested data to the host 30 that issued the read request.

As described above, the LLR table is generated using the a posteriori LLR instead of the estimated value k in the present embodiment. This makes it possible to further efficiently estimate the LLR table. For example, in the method using the estimated value k, the performance of the true LLR table may not be achieved with the increased number of times of estimation when there is a high level of mismatch between the default LLR table and the true LLR table. In contrast, in the present embodiment, even in such a mismatch, it is possible to generate an estimated LLR table closer to the true LLR table. This is because the process of generating the estimated LLR table in the present embodiment can be interpreted as equivalent to the process of estimating the LLR table in accordance with the Expectation Maximization (EM) algorithm. Details of this interpretation will be described below.

First, an outline of the EM algorithm will be described.

A piece of fixed data at hand is referred to as an observable variable, and the probability variable that can take various values because the data is incomplete is referred to as a latent variable. The EM algorithm is an iterative algorithm aiming at maximum likelihood estimation of an incomplete data set. The EM algorithm demonstrates that parameters change in a direction in which the log likelihood of incomplete data increases at each iterative update. The specific procedure is as follows.

(A1) Selecting an initial value of parameter ε.

(A2) Expectation step (E step): Obtaining a posterior probability of the latent variable under the condition of the current parameter e and the observable variable.

(A3) Maximization step (M step): Using a posterior probability of the latent variable obtained in the E step to calculate a parameter $\varepsilon_{new}$ that maximizes the expectation of the log likelihood of a complete data set in which the latent variable as well as the observable variable are determined.

(A4) In a case where the convergence criterion is not satisfied, determining as $\varepsilon=\varepsilon_{new}$ and returning to the E step.

The present embodiment can be interpreted as applying the EM algorithm to the problem of obtaining a codeword when the true LLR table is unknown. The correct codeword is a latent variable, the observable variable is a received word, and the parameter is an LLR table. It is also assumed that a decoder capable of calculating the posterior probability of the codeword is available. In this case, the process of estimating the LLR table is as follows. Since the purpose is to obtain a correct codeword, the following procedure ends when decoding is successful.

(B1) Assuming the default LLR table.

(B2) E step: Performing decoding to obtain the posterior probability using the current LLR table so as to obtain the posterior probability of the codeword. After successful decoding, an estimated codeword is output and the process ends.

(B3) M step: Using the posterior probability of the codeword obtained in the E step to calculate an LLR table that maximizes the expectation of the log likelihood of the pair of codewords and received words (complete data set). In a case where the LLR table has been updated, the process returns to the E step.

It is generally difficult to accurately calculate the posterior probability of a codeword. However, in a case where the channel is a memoryless channel, the posterior probability of the entire codeword (denoted by $p(\{x\}|\{y\})$) can be replaced with a sequence of the posterior probabilities of each bit of a codeword denoted by $\{p(x_1|\{y\}), p(x_2|\{y\}), \ldots, p(x_n|\{y\})\}=\{p(x|\{y\})\}$. The posterior probability $p(x_i|\{y\})$ is obtained by marginalizing $p(\{x\}|\{y\})$ with respect to all bits except $x_i$. The reason for this will be described below.

A sequence of the posterior probabilities $\{p(x|\{y\})\}$ can be efficiently calculated by belief propagation (BP) decoding, for example, in the case of using a code characterized by a graph structure not including a loop. While a commonly used code has a graph structure including a loop, it is known that a good approximation of $\{p(x|\{y\})\}$, denoted by $\{p^{BP}(x_1), p^{BP}(x_2), \ldots, p^{BP}(x_n)\}$ or $\{p^{BP}(x)\}$, is obtained by BP decoding even in this case. In the case of a memoryless channel, when a BP decoder is available, the process is as follows.

(C1) Assuming a default LLR table.

(C2) E step: Performing BP decoding using the current LLR table so as to obtain $\{p(x|\{y\})\}$. After successful decoding, an estimated codeword is output and the process ends.

(C3) M step: Using the posterior probability for each of symbols obtained in the E step to calculate an LLR table that maximizes the expectation of the log likelihood of the codewords and received words. In a case where the LLR table has been updated, the process returns to the E step.

In addition to the case of the channel being a memoryless channel, a case is considered where the channel for each of symbols has a multinomial distribution and the parameter is unchanged depending on the symbol. In the case when likelihood $p(x|y)$ is the multinomial distribution with an unchanged parameter, the process will be as follows.

(D1) Assuming a default LLR table.

(D2) E step: Performing BP decoding using the current LLR table so as to obtain $\{p(x|\{y\})\}$. After successful decoding, an estimated codeword is output and the process ends.

(D3) M step: Using a pair of $p^{BP}(x_i)$ obtained in E step and the corresponding received value $y_i=y$ to calculate for a received value y, denoted by $l^{(s+1)}(y)$, by the following Formula (8). In a case where the LLR table has been updated, the process returns to the E step.

$$l^{(s+1)}(y) = \ln\left(\frac{\sum_{i \in I(y)} p^{BP}(x_i = 0)}{\sum_{i \in I(y)} p^{BP}(x_i = 1)} \cdot \frac{\prod_{i=1}^{n} p^{BP}(x_i = 1)}{\prod_{i=1}^{n} p^{BP}(x_i = 0)}\right) \quad (8)$$

Figure 6:
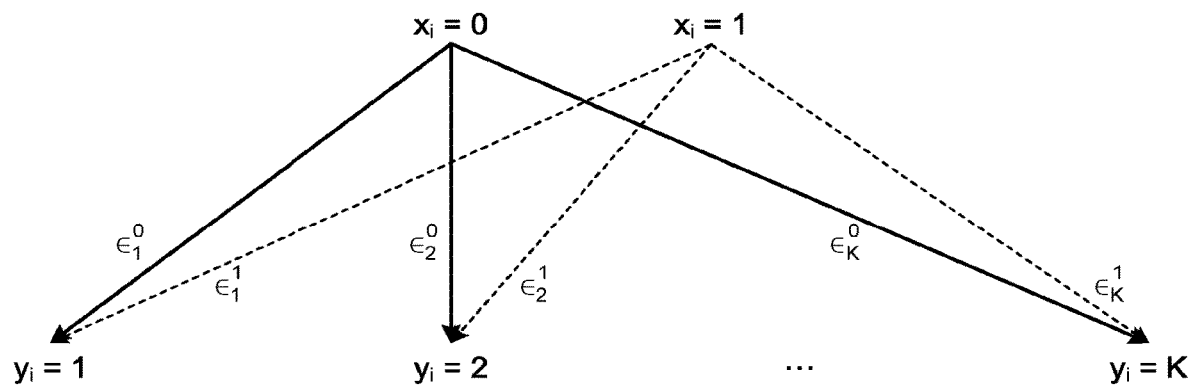
FIG. 6 is a diagram illustrating an example of a channel of each of symbols represented by a multinomial distribution.

FIG. 6 is a diagram illustrating parameters of the multinomial distribution. $\varepsilon^x_y$ corresponds to the conditional probability $P(y_i|x_i)$, that is, the likelihood that the received value $y_i$ can be obtained when the written value $x_i$ is given. Hereinafter, $\varepsilon^x_y$ will be referred to as a transition probability in some cases. In the example of FIG. 6, the transmitted value $x_i$ are 0 and 1, and the received value $y_i$ is 1 to K.

Using the transition probability $\varepsilon$ as a parameter, a new parameter $\varepsilon^x_y$ that maximizes the expectation of the log likelihood of the codeword and the received word is calculated under the normalization condition illustrated in the following Formula (9). The parameter $\varepsilon^x_y$ is calculated by the following Formula (10).

$$\sum_{y=1}^{K} \varepsilon^0_y = 1, \quad \sum_{y=1}^{K} \varepsilon^1_y = 1 \quad (9)$$

$$\varepsilon^x_y = \frac{\sum_{i \in I(y)} p^{BP}(x_i = x)}{\sum_{i=1}^{n} p^{BP}(x_i = x)} \quad (10)$$

Since the parameter $\varepsilon^x_y$ is the likelihood (transition probability), the log-likelihood ratio (LLR) can be expressed by the following Formula (11). Formula (8) is obtained from Formula (10) and Formula (11).

$$l^{(s+1)}(y) = \ln\left(\frac{\varepsilon^0_y}{\varepsilon^1_y}\right) \quad (11)$$

From the definition of the a posteriori LLR, an approximation of the posterior probability $p^{BP}$ can be expressed as the following Formula (12) using the sigmoid function $\sigma$. Inserting Formula (12) into Formula (8) leads to Formula (7).

$$p^{BP}(x_i=0)=\sigma(l_{APP,i}), p^{BP}(x_i=1)=\sigma(-l_{APP,i}) \quad (12)$$

Next, the following is the reason why the calculation necessary for the EM algorithm is possible with the posterior probability of each of symbols, rather than the posterior probability of the codeword, in a case where a memoryless channel is assumed.

In assuming a memoryless channel, $\varepsilon$ is a parameter that characterizes the channel for each of symbols, and H is a check matrix that characterizes the code used. The check matrix H is assumed to be fixed. The posterior probabilities of the complete data set can be decomposed into products for each of symbols. That is, when the transmitted word is {x} and the received word is {y}, the posterior probability of the complete data set can be expressed by the following Formula (13).

$$p(\{x\},\{y\}|\epsilon,H) \propto \Pi_{i=1}^{n} p(y_i|x_i,\epsilon) \qquad (13)$$

The expectation that is maximized in M step is calculated by the following Formula (14).

$$\sum_{x_1} \ldots \sum_{x_n} p(x_1, \ldots, x_n | \{y\}, \epsilon, H) \qquad (14)$$

$$\{\ln p(y_1|x_1, \epsilon) + \ldots + \ln p(y_n|x_n, \epsilon)\}$$

For example, calculating the term $\ln p(y_1|x_1, \epsilon)$ will lead to the posterior probability obtained by marginalizing the posterior probability of a codeword $p(\{x\}|\{y\})$ with respect to $x_1$. A sequence of the posterior probability $\{p(x|\{y\})\}$ can be efficiently calculated by BP decoding. For example, in the case of an LDPC code, using the sum-product decoding method enables accurate calculation of $\{p(x|\{y\})\}$ with complexity linearly proportional to the code length, when the check matrix includes no cycles. It is known that even when the check matrix includes cycles, the result of the sum-product decoding is a good approximation of $\{p(x|\{y\})\}$. As for codes other than LDPC codes, the posterior probabilities can be calculated approximately even with codes that can execute approximate BP decoding. Even when an exact posterior probability cannot be calculated, an approximate formula as illustrated in the following Formula (15) is obtained using the approximate posterior probability $p^{BP}(x_1)$.

$$\sum_{x_1} \ln p(y_1|x_1, \epsilon) \sum_{x_2} \ldots \sum_{x_n} p(x_1, \ldots, x_n | \{y\}, \epsilon, H) \simeq \qquad (15)$$

$$\sum_{x_1} \ln p(y_1|x_1, \epsilon) p^{BP}(x_1)$$

As a result, the expectation that is maximized in M step can be expressed by the following Formula (16). As illustrated in Formula (16), calculation of the expectation is reduced from the exhaustive enumeration of $2^n$ codewords in Formula (14) to the addition of n terms in Formula (16). Substituting the multinomial distribution defined in FIG. 6 into $p(y_i|x_i, \epsilon)$ of Formula (16) and maximizing $\epsilon_y^x$ under the condition of Formula (9) will lead to Formula (10), and substituting the result for the definition of the log-likelihood ratio will lead to Formula (8).

$$\sum_{i=1}^{n} p^{BP}(x_i) \ln p(y_i|x_i, \epsilon) \qquad (16)$$

First Modification

Note that the estimated LLR-table generation unit 105 may calculate a new LLR value according to Formula (17) so as to correct the bias of the transmitted value stored in the nonvolatile memory. $p_s$ is the probability of an information bit x to be encoded by a systematic code. For example, $p_s(x=0)$ represents the probability that x is 0, and $p_s(x=1)$ represents the probability that x is 1. Asymmetric coding is an example of applicable error mitigation code that is used to give bias to symbols. The term including $p_s$ corresponds to a value for correcting the bias of the transmitted value stored in the nonvolatile memory.

$$l^{(s+1)}(y) = \ln \frac{\sum_{i \in (y)} \sigma(l_{APP,i}^{(s)})}{\sum_{i \in (y)} \sigma(-l_{APP,i}^{(s)})} - \ln \frac{\sum_{i=1}^{n} \sigma(l_{APP,i}^{(s)})}{\sum_{i=1}^{n} \sigma(-l_{APP,i}^{(s)})} + \ln \frac{p_s(x=0)}{p_s(x=1)} \qquad (17)$$

Second Modification

Figure 7:
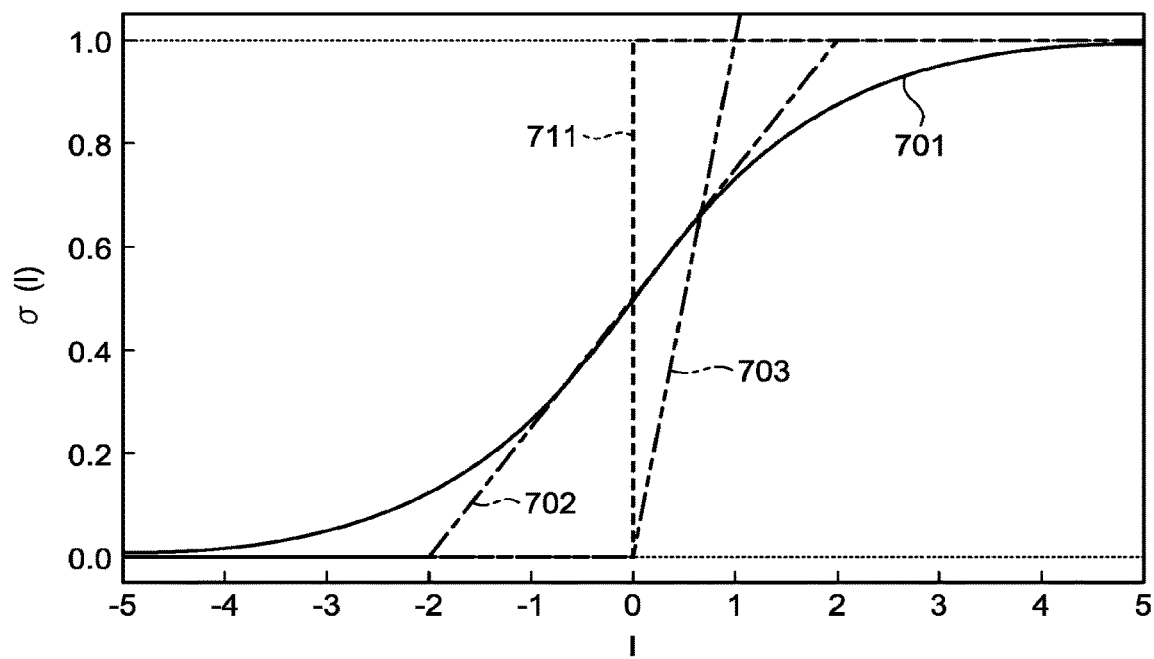
FIG. 7 is a diagram illustrating examples of functions other than sigmoid functions.

While Formulas (7) and (17) or the like use the sigmoid function, other functions may be used instead of the sigmoid function as long as the function is a function in which the output value for at least three input values increases monotonically. FIG. 7 is a diagram illustrating examples of sigmoid functions and functions other than sigmoid functions. Functions 701, 702, and 703 are examples of functions in which output values for at least three input values monotonically increase. The function 701 is a sigmoid function. The function 702 is a function including a linear function in which l increases monotonically when the absolute value of l is less than 2. The function 703 is a function including a linear function that monotonically increases when l is greater than 0.

Note that the function 711 is a step function whose value increases stepwise when l is 0, and thus does not correspond to a function that monotonically increases the output value for at least three input values. A value obtained by converting an a posteriori LLR ($l^{(S)}_{APP,i}$) using the function 711 corresponds to the estimated value k. Therefore, a configuration using the function 711 instead of the sigmoid function corresponds to a configuration in which an LLR table is generated on the basis of the estimated value k.

As described above, in the present embodiment, even when decoding fails, an estimated LLR table is generated one or more times using the sequence {l} of the a posteriori LLR obtained by this decoding that has failed. This iterative estimation makes it possible to bring the channel to be estimated closer to the true channel.

Second Embodiment

Next, a memory system according to attached second embodiment will be described in detail with reference to the drawings. The following description refers to the configurations and operations similar to those of the first embodiment, thereby omitting redundant description.

The memory system according to the present embodiment may have a configuration similar to the memory system 1 described with reference to FIG. 1 in the first embodiment. In the present embodiment, however, the soft decision decoding unit 182 in FIG. 4 is replaced with a soft decision decoding unit 282 illustrated in FIG. 8.

Figure 8:
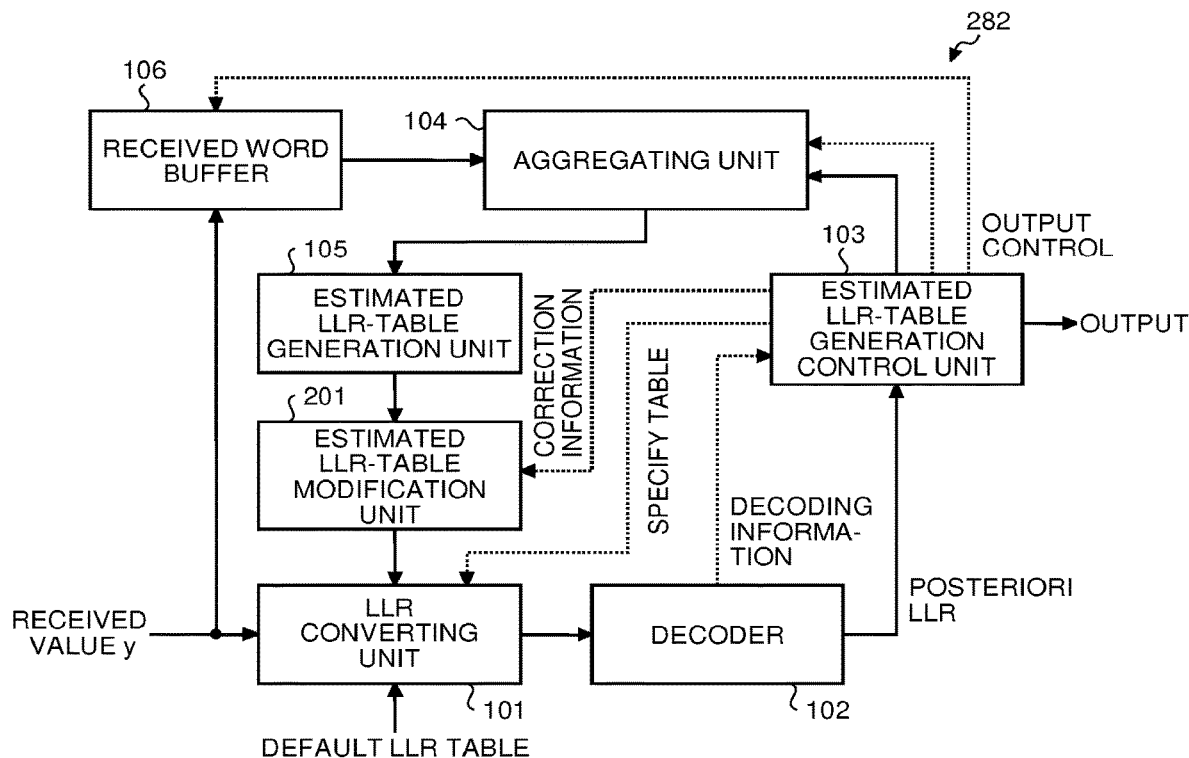
FIG. 8 is a block diagram illustrating a more detailed configuration example of a soft decision decoding unit according to a second embodiment.

As illustrated in FIG. 8, the soft decision decoding unit 282 according to the present embodiment further includes an estimated LLR-table modification unit 201 in addition to the configuration similar to the soft decision decoding unit 182 illustrated in FIG. 4. The estimated LLR-table modification unit 201 modifies the estimated LLR table generated by the estimated LLR-table generation unit 105 in accordance with an instruction from the estimated LLR-table generation control unit 103. The instruction requires the estimated LLR-table modification unit 201 to input the modified estimated LLR table to the LLR converting unit 101.

Figure 9:
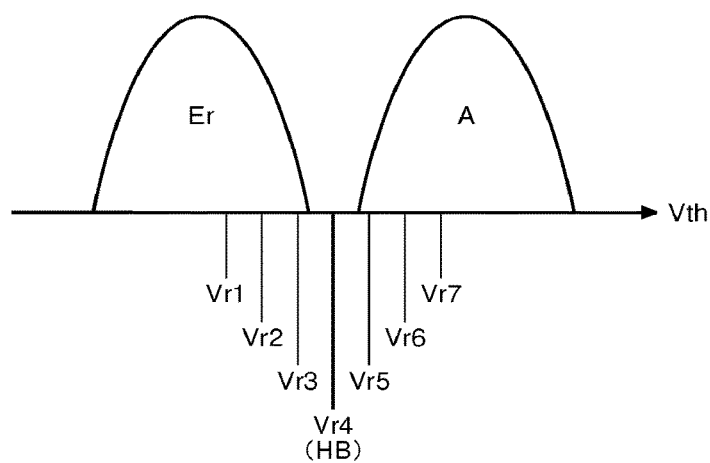
FIG. 9 is a schematic diagram illustrating a relationship between a threshold voltage distribution and a read voltage.

Here, an example of modification performed by the estimated LLR-table modification unit 201 will be described. FIG. 9 is a schematic diagram illustrating a relationship between a threshold voltage distribution and the read voltage in a case where each of memory cells constituting the nonvolatile memory 20 is a single level cell (SLC) storing 1-bit data. In FIG. 9, Er distribution indicates a threshold voltage distribution of a memory cell in which data '1' is written, and A distribution indicates a threshold voltage distribution of a memory cell in which data '0' is written, for example. Vr1 to Vr7 illustrate examples of read voltages (hereinafter referred to as read levels) used at data reading from memory cells. The voltage Vr4 represents an example of the read level to be used for hard decision read (hard bit read), while Vr1 to Vr3 and Vr5 to Vr7 represent an example of the read level to be used for soft decision read (soft bit read).

In a case where the threshold voltage of a memory cell is, for example, a voltage near the peak of the Er distribution, the value of data stored in the memory cell is likely to be '1'. Similarly, in a case where the threshold voltage of a memory cell is, for example, a voltage near the peak of the A distribution, the value of data stored in the memory cell is likely to be '0'. Therefore, as an example of modification performed by the estimated LLR-table modification unit 201 in such a case, the absolute value of the LLR value assigned to the cells of which voltages are near the peaks becomes a high value.

In a case where the threshold voltage of a memory cell is a voltage near the boundary between the Er distribution and the A distribution, the value of data stored in the memory cell can be '1' or '0' with substantially equal probabilities. Therefore, as an example of the modification performed by the estimated LLR-table modification unit 201 in such a case, the sign of the LLR value assigned to the cells of which voltages are near the boundary may be reversed.

The modification method to be applied may be various methods such as a method of setting the absolute value of the LLR value as a fixed value and a method of adding or subtracting a predetermined value to the absolute value of the LLR value.

Figure 10:
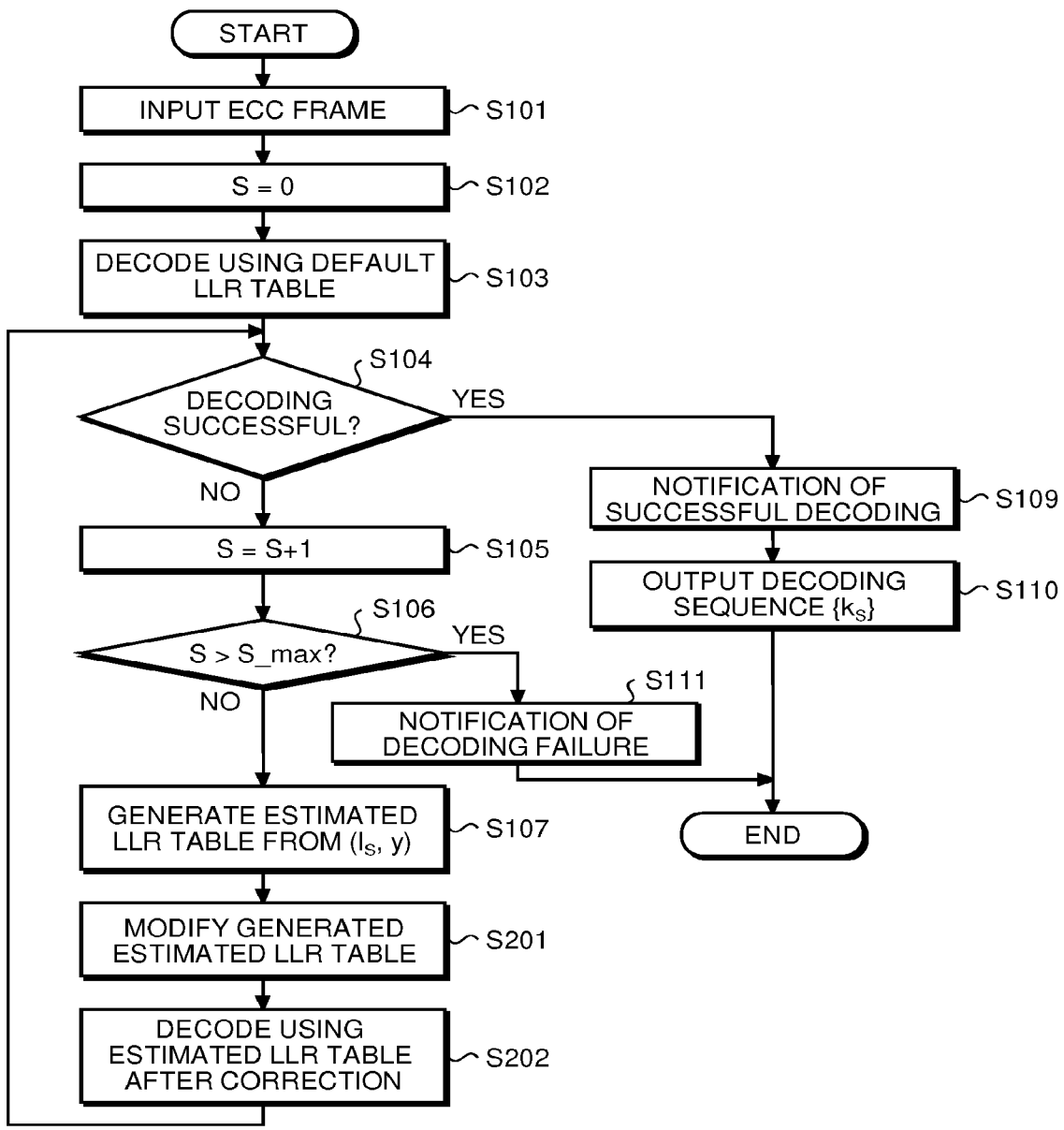
FIG. 10 is a flowchart illustrating a schematic example of decoding operation according to the second embodiment.

Next, the decoding operation according to the present embodiment will be described in detail with reference to the drawings. FIG. 10 is a flowchart illustrating a schematic example of the decoding operation according to the present embodiment. As illustrated in FIG. 10, the decoding operation according to the present embodiment has replaced step S108 with steps S201 to S202 in the operation similar to the decoding operation according to the first embodiment illustrated in FIG. 5.

That is, in the present embodiment, an estimated LLR table is generated from a $(l_S, y)$ pair including an a posteriori LLR $l_S$ and a received value y obtained by decoding in step S103 or S202 (step S107), and thereafter, the generated estimated LLR table is modified (step S201). Specifically, the estimated LLR table generated by the estimated LLR-table generation unit 105 is input to the estimated LLR-table modification unit 201. Thereafter, the estimated LLR-table modification unit 201 modifies the estimated LLR table in accordance with the modification information input from the estimated LLR-table generation control unit 103. Then, the estimated LLR-table modification unit 201 inputs the modified estimated LLR table to the LLR converting unit 101.

Next, the sequence $\{y\}$ of the received values y is decoded using the modified estimated LLR table (step S202).

Other configurations, operations, and effects are similar to the case in the above-described embodiment, detailed description thereof is omitted here.

Third Embodiment

Next, a memory system according to a third embodiment will be described in detail with reference to the drawings. The following description refers to the configurations and operations similar to those of the first and second embodiments, thereby omitting redundant description.

The first or second embodiment described above are exemplary cases where the estimated LLR table is generated on the basis of the decoding result of one ECC frame. In contrast, the third embodiment is an exemplary case where an estimated LLR table is generated on the basis of decoding results of a plurality (predetermined number) of ECC frames.

In channels that are assumed to be influenced by similar noise, the conditional probability P(y|x) obtained from these channels would be similar. Therefore, in the present embodiment, in a case where a plurality of ECC frames on a similar channel can be processed collectively, an estimated LLR table will be generated from the aggregated result of all the ECC frames. This makes it possible to increase the number of (l, y) pairs used to generate the estimated LLR table, making it possible to estimate the channel closer to the true channel.

The configuration of the memory system and its decoding unit according to the present embodiment may be similar to the configuration of the memory system 1 and its soft decision decoding unit 182 or 282 according to the first or second embodiment described above, for example. In the present embodiment, however, the soft decision decoding unit 182 or 282 is configured to be able to process a plurality of ECC frames collectively, and a plurality of ECC frames is input to the decoder 102, and a plurality of ECC frames is stored in the received word buffer 106.

Next, the decoding operation according to the present embodiment will be described in detail with reference to the drawings. The following description is based on the decoding operation (refer to FIG. 10) exemplified in the second embodiment, but is not limited to this.

Figure 11:
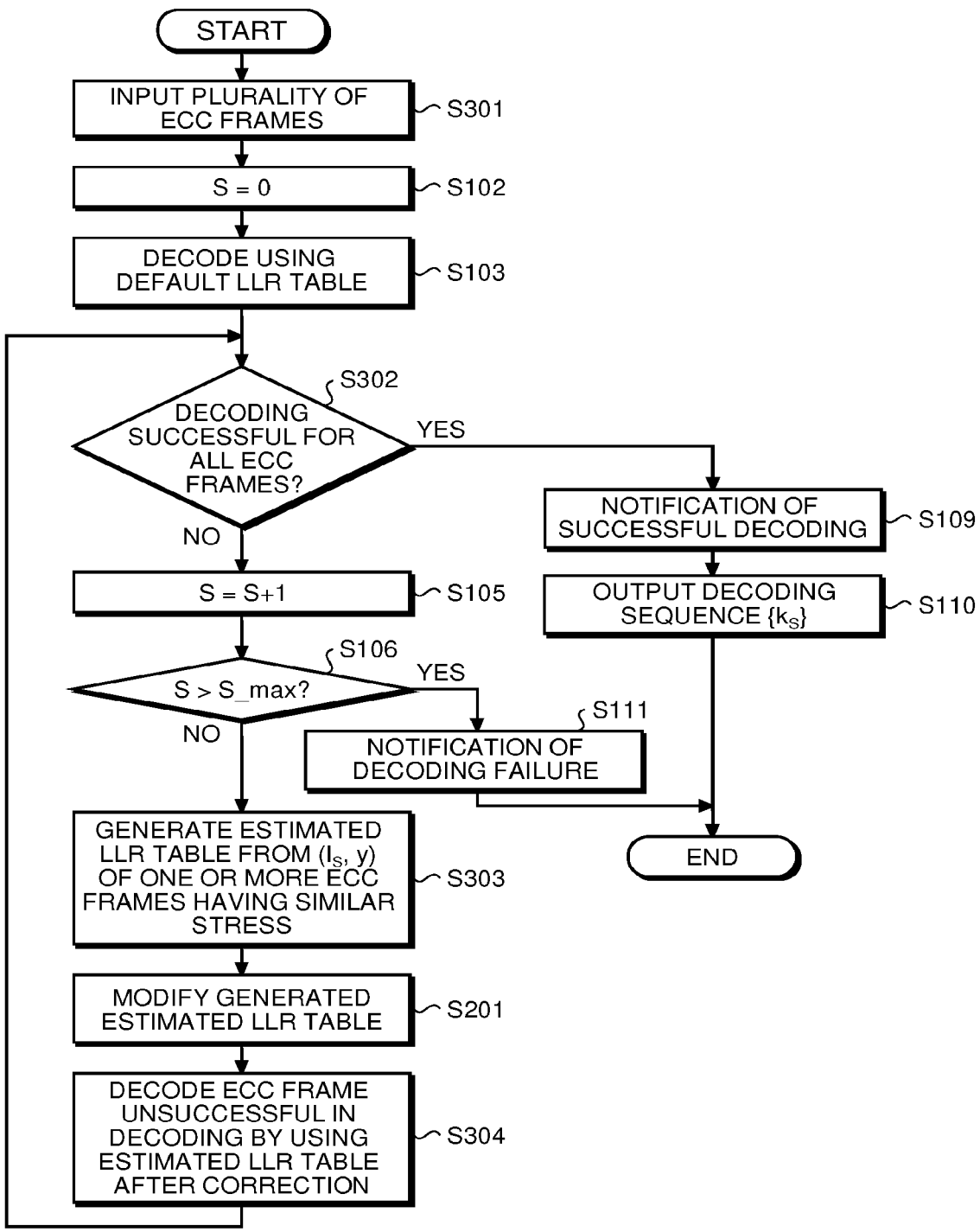
FIG. 11 is a flowchart illustrating a schematic example of decoding operation according to a third embodiment.

FIG. 11 is a flowchart illustrating a schematic example of the decoding operation according to the present embodiment. As illustrated in FIG. 11, the decoding operation according to the present embodiment has replaced steps S101, S104, S107, and S202 respectively with steps S301, S302, S303 and S304 in the operation similar to the decoding operation according to the second embodiment illustrated in FIG. 10.

That is, in the present embodiment, first, a sequence $\{y\}$ of a plurality of ECC frames read from the nonvolatile memory 20 by the memory I/F 13 is input to the soft decision decoding unit 282 (step S301).

Next, after the count value S is reset (S=0) (step S102), the sequence $\{y\}$ of the plurality of ECC frame that has been input is decoded using a predetermined LLR table (step S103). Note that the decoding of the sequence $\{y\}$ of individual ECC frames may be similar to the above-described embodiment.

Next, the estimated LLR-table generation control unit 103 determines whether decoding of all ECC frames has been successful (step S302). In a case where decoding of all the ECC frames has been successful (YES in step S302), the operation proceeds to step S109, and the subsequent operations are executed. In contrast, in a case where there is an ECC frame that has failed to be decoded (NO in step S302), the count value S is incremented by 1 (step S105), and a determination is made whether the incremented count value S is greater than the maximum value S_max (step S106). Thereafter, in a case where the count value S is greater than the maximum value S_max (YES in step S106), the operation proceeds to step S111 and the subsequent operations are executed. In contrast, in a case where the count value S is the maximum value S_max or less (NO in step S106), the operation proceeds to step S303.

In step S303, an estimated LLR table is generated from the ($l_S$, y) pair including a sequence $\{l_S\}$ of one or more ECC frames $l_S$ affected by a similar stress Next, among all ECC frames, a sequence $\{y\}$ of the received value y of ECC frames that have not been successfully decoded will be decoded using the modified estimated LLR table (step S304). Note that the decoding of the sequence $\{y\}$ of individual ECC frames may be similar to the above-described embodiment. Thereafter, this operation returns to step S302.

Other configurations, operations, and effects are similar to the case in the above-described embodiment, detailed description thereof is omitted here.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory; and
   a memory controller configured to
      convert a received value read from the nonvolatile memory into first likelihood information by using a first conversion table,
      execute decoding on the first likelihood information and output a posterior value,
      output an estimated value of the received value obtained on the basis of the posterior value in a case where the decoding is successful,
      generate a second conversion table on the basis of the posterior value in a case where the decoding fails,
      convert the received value into second likelihood information using the second conversion table in a case where the second conversion table has been generated, and
      execute decoding on the second likelihood information and output a posterior value.

2. The memory system according to claim 1, wherein the memory controller is configured to:
   calculate likelihood information corresponding to the received value by using a value obtained by inputting the posterior value to a function in which output values for at least three input values monotonically increase, and
   generate the second conversion table associating the received value with the calculated likelihood information.

3. The memory system according to claim 2, wherein the function is a sigmoid function.

4. The memory system according to claim 2, wherein the function is a function that includes a monotonically increasing linear function.

5. The memory system according to claim 2, wherein the memory controller is configured to:
   calculate likelihood information corresponding to the received value by using a value obtained by inputting the posterior value to the function and using a value for correcting a bias of a transmitted value stored in the nonvolatile memory, and
   generate the second conversion table associating the received value with the calculated likelihood information.

6. The memory system according to claim 1, wherein the memory controller is configured to:
   generate a new second conversion table on the basis of a posterior value obtained by decoding that has resulted in a failure every time the decoding of the second likelihood information fails,
   convert the received value into the second likelihood information by using the newly generated second conversion table every time the second conversion table is generated, and
   decode the second likelihood information every time the received value is converted into the second likelihood information.

7. The memory system according to claim 1, wherein the memory controller is configured to:
   modify the generated second conversion table, and
   convert the received value into the second likelihood information by using the modified second conversion table.

8. The memory system according to claim 1, wherein the memory controller is configured to:
   convert a sequence of the received value into a sequence of likelihood information including a predetermined number of pieces of the first likelihood information or the second likelihood information in units of the sequence of a received value including a predetermined number of the received values, and
   execute the decoding in units of the likelihood information sequence.

9. A method for controlling a nonvolatile memory, the method comprising:
   converting, by a memory controller, a received value read from the nonvolatile memory into first likelihood information by using a first conversion table,
   executing, by the memory controller, decoding on the first likelihood information and outputting a posterior value,
   outputting, by the memory controller, an estimated value of the received value obtained on the basis of the posterior value in a case where the decoding is successful,
   generating, by the memory controller, a second conversion table on the basis of the posterior value in a case where the decoding fails,
   converting, by the memory controller, the received value into second likelihood information by using the second conversion table in a case where the second conversion table has been generated, and
   executing, by the memory controller, decoding on the second likelihood information and outputting a posterior value.

10. The method according to claim 9 further comprising:
calculating, by the memory controller, likelihood information corresponding to the received value by using a value obtained by inputting the posterior value to a function in which output values for at least three input values monotonically increase; and
generating, by the memory controller, the second conversion table associating the received value with the calculated likelihood information.

11. The method according to claim 10, wherein the function is a sigmoid function.

12. The method according to claim 10, wherein the function is a function that includes a monotonically increasing linear function.

13. The method according to claim 10 further comprising:
calculating, by the memory controller, likelihood information corresponding to the received value by using a value obtained by inputting the posterior value to the function and using a value for correcting a bias of a transmitted value stored in the nonvolatile memory, and
generating, by the memory controller, the second conversion table associating the received value with the calculated likelihood information.

14. The method according to claim 9 further comprising:
generating, by the memory controller, a new second conversion table on the basis of a posterior value obtained by decoding that has resulted in a failure every time the decoding of the second likelihood information fails,
converting, by the memory controller, the received value into the second likelihood information by using the newly generated second conversion table every time the second conversion table is generated, and
decoding, by the memory controller, the second likelihood information every time the received value is converted into the second likelihood information.

15. The method according to claim 9 further comprising:
modifying, by the memory controller, the generated second conversion table; and
converting, by the memory controller, the received value into the second likelihood information by using the modified second conversion table.

16. The method according to claim 9 further comprising:
converting, by the memory controller, a sequence of the received value into a sequence of likelihood information including a predetermined number of pieces of the first likelihood information or the second likelihood information in units of the sequence of a received value including a predetermined number of the received values, and
executing, by the memory controller, the decoding in units of the likelihood information sequence.

\* \* \* \* \*